US007235467B2

(12) United States Patent
Hong et al.

(10) Patent No.: US 7,235,467 B2
(45) Date of Patent: Jun. 26, 2007

(54) METHOD FOR FORMING A SEMICONDUCTOR DEVICE HAVING A STRUCTURE OF A SINGLE CRYSTAL SCANDIUM OXIDE FILM FORMED ON A SILICON SUBSTRATE

(75) Inventors: Ming-Hwei Hong, Hsinchu (TW); Jueinai Kwo, Hsinchu (TW); Chih-Ping Chen, Hsinchu (TW); Shiang-Pi Chang, Taipei Hsien (TW); Wei-Chin Lee, Taipei (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 11/380,518

(22) Filed: Apr. 27, 2006

(65) Prior Publication Data

US 2007/0010102 A1  Jan. 11, 2007

(30) Foreign Application Priority Data

Jul. 8, 2005  (TW) .............................. 94123194 A

(51) Int. Cl.
*H01L 21/31* (2006.01)

(52) U.S. Cl. ................ 438/487; 438/763; 257/E21.426
(58) Field of Classification Search ................ 438/758, 438/478, 455, 463, 763
See application file for complete search history.

(56) References Cited

U.S. PATENT DOCUMENTS

| 6,455,173 | B1* | 9/2002 | Marijnissen et al. | 428/623 |
| 2004/0191407 | A1* | 9/2004 | Ohbayashi | 247/10 |
| 2006/0124961 | A1* | 6/2006 | Sakaguchi et al. | 257/192 |
| 2006/0127699 | A1* | 6/2006 | Moelle et al. | 428/698 |

OTHER PUBLICATIONS

M. Hong, et al, Single-crystal $GaN/Gd_2O_3/GaN$ heterostructure, J. Vac. Sci. Technol. B 20(3), May/Jun. 2002, pp. 1274-1277.

* cited by examiner

*Primary Examiner*—Chandra Chaudhari
*Assistant Examiner*—Victor V. Yevsikov
(74) *Attorney, Agent, or Firm*—Darby & Darby

(57) ABSTRACT

A method for forming a semiconductor device includes placing a Si substrate and an $Sc_2O_3$ powder source in an oxide chamber, and vaporizing the $Sc_2O_3$ powder source in the oxide chamber so as to form a single crystal $Sc_2O_3$ film on the Si substrate through electron beam evaporation techniques.

10 Claims, 4 Drawing Sheets

METHOD FOR FORMING A SEMICONDUCTOR DEVICE HAVING A STRUCTURE OF A SINGLE CRYSTAL SCANDIUM OXIDE FILM FORMED ON A SILICON SUBSTRATE

CROSS-REFERENCE TO RELATED APPLICATIONS

This application claims priority of Taiwanese application no. 094123194, filed on Jul. 8, 2005.

BACKGROUND OF THE INVENTION

1. Field of the Invention

This invention relates to a method for forming a semiconductor device, more particularly to a method for forming a semiconductor device that involves forming a single crystal scandium oxide ($Sc_2O_3$) film on a silicon (Si) substrate through electron beam evaporation techniques using a $Sc_2O_3$ powder source.

2. Description of the Related Art

Heteroepitaxy and heterogrowth of a semiconductor film between an insulator layer and a semiconductor substrate have always attracted a lot of interest in scientific research and development, and industrial applications.

Formation of compound semiconductors on a substrate is an important application of the heteroepitaxy techniques. One attention-grabbing example is epitaxial growth of compound semiconductors of GaN series on a sapphire substrate. The layered structure of GaN/sapphire has been used in the manufacture of a blue or green light emitting diode. However, since the sapphire substrate has a poor heat-dissipating property and is relatively expensive, application of the sapphire substrate to light emitting devices having a relatively large size is limited. In addition, since the sapphire substrate has a relatively high hardness, the yield of the light emitting devices during subsequent grinding and cutting operations is relatively low, whereas the production cost of the same is relatively high.

However, the most difficult barrier to growth of an epitaxial film on a substrate is that the epitaxial film has to match the substrate in lattice constant so as to avoid occurrence of lattice defects, or even chip bending, due to stress.

Recently, growth of an epitaxial film of a compound semiconductor indirectly on a Si substrate through an insulating oxide film has been realized, which opens the possibility to replace the sapphire substrate with the Si substrate.

M. Hong et al. have described a heterostructure including a sapphire substrate, a first GaN film, an interfacial film made from $Gd_2O_3$ or $Y_2O_3$ and epitaxially grown on the first GaN film, and a second GaN film epitaxially grown on the interfacial film ("Single-crystal GaN/$Gd_2O_3$/GaN heterostructure," J. Vac. Sci. Technol. B 20(3), May/June 2002, pp. 1274 to 1277). It has been found that despite a large mismatch in the lattice constant, $Gd_2O_3$ or $Y_2O_3$ can be epitaxially grown on the single-crystal GaN film, thereby permitting epitaxial growth of a GaN film thereon. The GaN film grown on the $Gd_2O_3$ or $Y_2O_3$ film has the same crystallographic hexagonal close-packed (hap) structure as the underlying GaN film.

Formation of a $Sc_2O_3$ epitaxy film on a Si substrate is conventionally conducted by using metal scandium (Sc) as the source material in an evacuated chamber. When Sc is heated to form evaporated Sc atoms, an oxygen gas is injected into the evacuated chamber to react with the evaporated Sc atoms to form compound $Sc_2O_3$. The compound $Sc_2O_3$ is then deposited on the Si substrate. However, the $Sc_2O_3$ film thus deposited on the Si substrate is not a single domain film, and has a poor crystallization quality, which can result in a relatively high defect density in the compound semiconductor epitaxially grown thereon, and which can deteriorate performance of the electronic devices manufactured therefrom Therefore, there is still a need in the art to provide a method for forming a single crystal $Sc_2O_3$ film of improved crystallization quality on a Si substrate.

SUMMARY OF THE INVENTION

The object of the present invention is to provide a method for forming a semiconductor device, which involves forming a single crystal $Sc_2O_3$ film on a Si substrate, which is economical, and which is free from the abovementioned drawbacks of the prior art.

According to this invention, a method for forming a semiconductor device includes placing a Si substrate and an $Sc_2O_3$ powder source in an oxide chamber, and vaporizing the $Sc_2O_3$ powder source in the oxide chamber so as to form a single crystal $Sc_2O_3$ film on the Si substrate through electron beam evaporation techniques.

BRIEF DESCRIPTION OF THE DRAWINGS

Other features and advantages of the present invention will become apparent in the following detailed description of the preferred embodiment of the invention, with reference to the accompanying drawings. In the drawings.

DETAILED DESCRIPTION OF THE PREFERRED EMBODIMENT

Figure 1:
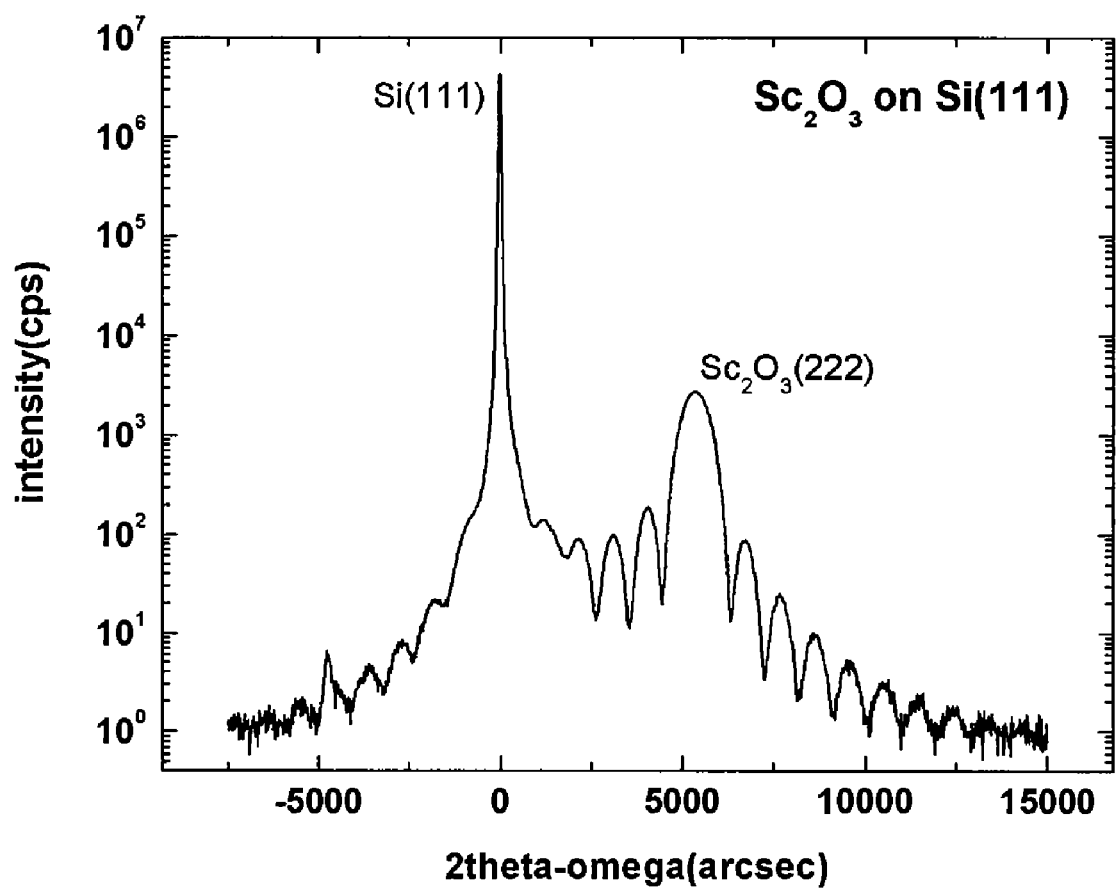
FIG. 1 illustrates a single-crystal X-ray scan plot along a surface normal to the plane (111) of a Si substrate of an amorphous Si cap layer/$Sc_2O_3$ film/Si substrate structure made by the preferred embodiment of a method according to this invention.

The preferred embodiment of a method for forming a semiconductor device according to this invention includes placing a Si substrate and an $Sc_2O_3$ powder source in an oxide chamber, and vaporizing the $Sc_2O_3$ powder source in the oxide chamber so as to form a single crystal $Sc_2O_3$ film on the Si substrate through electron beam evaporation techniques. One or more GaN layers can be subsequently overgrown epitaxially on the single crystal $Sc_2O_3$ film.

Preferably, the single crystal $Sc_2O_3$ film is formed on the plane (111) of the Si substrate.

In addition, vaporization of the $Sc_2O_3$ powder source is preferably conducted at a substrate temperature of 25° C. to 1200° C. under a vacuum pressure of $1\times10^{-10}$ Torr to $1\times10^{-5}$ Torr. More preferably, the substrate temperature and the vacuum pressure are set at 770° C. and $1\times10^{-9}$ Torr, respectively.

Preferably, the method of this invention further includes the steps of removing native oxides formed on the Si substrate, prior to placement of the Si substrate in the oxide chamber.

Removal of the native oxides formed on the Si substrate can be conducted through RCA-cleaning and with an HF dip. Alternatively, removal of the native oxides can be conducted through atom bombardment techniques at a temperature ranging from 700° C. to 1000° C. More preferably, the native oxides are removed at a temperature ranging from 800° C. to 900° C. Most preferably, the native oxides are removed at 890° C.

In addition, the method of this invention preferably further includes forming a cap layer on the single crystal $Sc_2O_3$ film on the Si substrate. More preferably, the cap layer is made from a material selected from the group consisting of amorphous silicon, silica, and alumina.

Preferably, the method of this invention includes forming an epitaxy layer made from a group III-V compound on the single crystal $Sc_2O_3$ film in the case where the cap layer is not formed or in the case where the cap layer is removed. More preferably, the group III-V compound includes a group III element selected from the group consisting of B, Al, Ga, In, Ti, and combinations thereof, and a group V element selected from the group consisting of N, P, As, Sb, Bi, and combinations thereof. Most preferably, the epitaxy layer is made from a group III-V compound selected from the group consisting of GaN, GaAs, AlN, InN, AlP, AlAs, AlSb, InP, InAs, InSb, GaSb, and GaP.

EXAMPLE

Preparation of an Amorphous Si Cap Layer/$Sc_2O_3$ Film/Si Semiconductor Structure A Si substrate specimen that has a diamond cubic crystal structure and that has a plane (111) was put in an ultra high vacuum (UHV) chamber of a multi-chamber molecular beam epitaxy (MBE)/UHV system. The inside pressure of the UHV chamber was maintained below about $10^{-9}$ torr. The Si substrate was then heated to a temperature of 890° C., and was subjected to a Si atom bombardment treatment so as to remove native oxides formed on the Si substrate, and so as to simultaneously deposit a fraction of a monolayer of Si on the Si substrate. The Si substrate thus formed was examined by in situ reflection high-energy electron diffraction (RHEED) (not shown), and a streaky sharp RHEED pattern (not shown), which proves removal of the native oxides, was obtained.

Thereafter, additional Si films that have a total thickness of about 3 nm were grown on the Si substrate through MBE techniques so as to ensure that the plane (111) of the Si substrate is chemically clean, atomically ordered, and (7×7) reconstructed.

The Si substrate was then transferred under UHV to an oxide chamber of the MBE/UHV system for performing $Sc_2O_3$ deposition. An $Sc_2O_3$ film with a thickness of about 1 nm was epitaxially grown on the Si substrate. The $Sc_2O_3$ film was grown on the Si substrate at a substrate temperature of 770° C. through electron beam evaporation of a pure powder-packed $Sc_2O_3$ source. During formation of the $Sc_2O_3$ film, the oxide chamber was maintained at a vacuum pressure of below $10^{-9}$ torr. When the Si substrate formed with the 1 nm thick $Sc_2O_3$ film was examined by RHEED, a streaky, (4×4) and six-fold symmetry RHEED pattern (not shown) along the major in-plane axes of the Si substrate was observed, which is an indication of an in-plane alignment between the $Sc_2O_3$ film and the Si substrate.

The Si substrate together with the $Sc_2O_3$ film was then transferred to another oxide chamber for further growing of the $Sc_2O_3$ film. The growing process was terminated after the thickness of the $Sc_2O_3$ film reached 5 nm. An amorphous Si cap layer having a thickness of 2.4 nm was then deposited on the $Sc_2O_3$ film so as to protect the $Sc_2O_3$ film.

Determination of Characteristics of the Amorphous Si Cap Layer/$Sc_2O_3$ Film/Si Substrate Structure The amorphous Si cap layer/$Sc_2O_3$ film/Si substrate structure thus formed was examined by RHEED, and streaky RHEED patterns (not shown) along the in-plane axes of [110] and [112] were obtained. The streaks shown in the RHEED patterns demonstrate that the $Sc_2O_3$ film has the same in-plane symmetry as that of the plane (111) of the Si substrate. In addition, the results show that the crystal structure of the $Sc_2O_3$ film has a cubic lattice.

FIG. 1 shows a single-crystal X-ray scan plot along the surface normal around the plane (111) of the Si substrate. Aside from the strong peaks from the plane (111) of the Si substrate and the plane (222) of the $Sc_2O_3$ film, striking fringes near 5000 arcsec are observed. These well-defined Pendellosung oscillations, which are caused by dynamic XRD, are very sensitive to the perfection of the atomic structure. Modest imperfections are known to completely destroy these fringes. The result shown in FIG. 1 strongly testifies the high quality of the $Sc_2O_3$ film of this invention, and also indicates that the $Sc_2O_3$ film is very uniform and has a smooth surface and a smooth interface.

Figure 2:
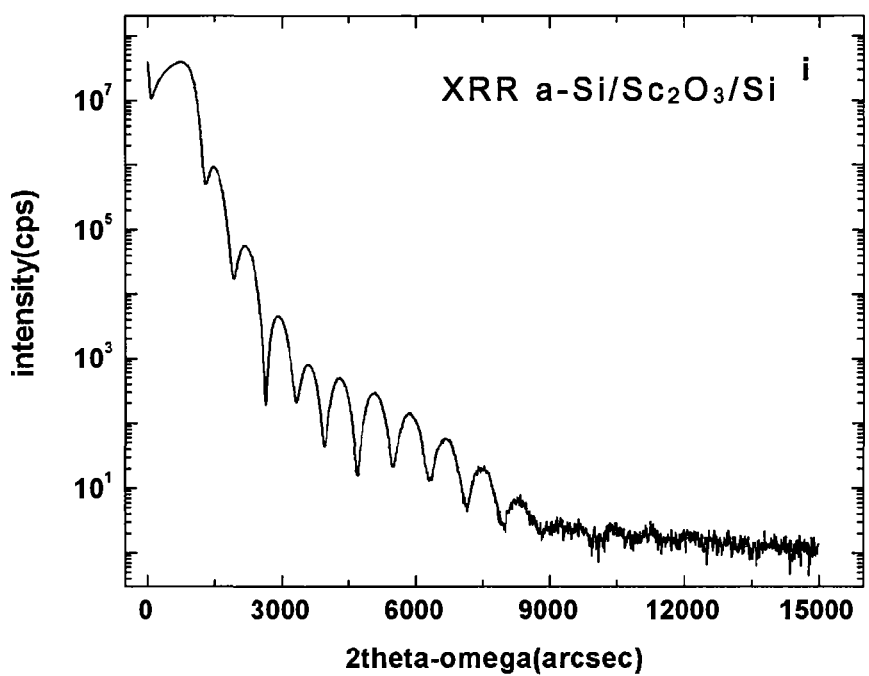
FIG. 2 is a plot to illustrate small-angle X-ray reflectivity measurement results of interfaces between air and an amorphous Si cap layer, between the Si cap layer and the $Sc_2O_3$ film, and between the $Sc_2O_3$ film and the Si substrate in the amorphous Si cap layer/$Sc_2O_3$ film/Si substrate structure made by the preferred embodiment.

Referring to FIG. 2, a strong intensity oscillation at small-angle reflectivity indicates that the $Sc_2O_3$ film is highly uniform. The interface between the $Sc_2O_3$ film and the Si substrate is also smooth. Note that the intensity measurement in this embodiment covers eight orders of magnitude. The small angle reflectivity quantifies a fairly accurate film thickness of about 181 Å. The analysis of the reflectivity measurement gives not only the $Sc_2O_3$ film thickness but also the thickness of the Si cap layer. The interfacial roughness between the $Sc_2O_3$ film and the Si substrate is estimated to be about 6 Å. The interfacial roughness between the Si cap layer and the $Sc_2O_3$ film is estimated to be about 11.93 Å. The interfacial roughness between air and the Si cap layer is estimated to be about 11.48 Å. Besides, the Si substrate may be subjected to RCA cleaning and HF dipping treatments before being placed in the UHV chamber so that the roughness of the interface between the $Sc_2O_3$ film and the Si substrate can be further improved.

Figure 3:
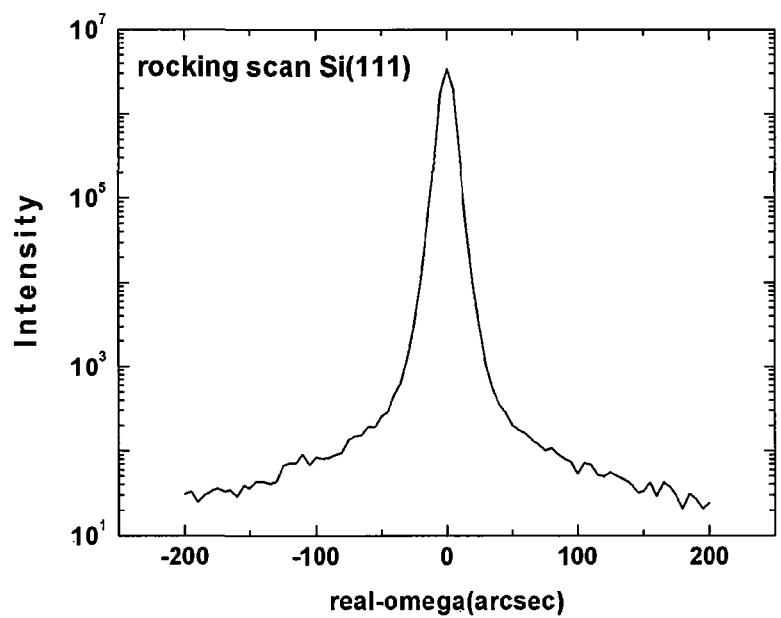
FIG. 3 is a plot to illustrate rocking scan results of the plane (111) of the Si substrate of the amorphous Si cap layer/$Sc_2O_3$ film/Si substrate structure made by the preferred embodiment.
Figure 4:
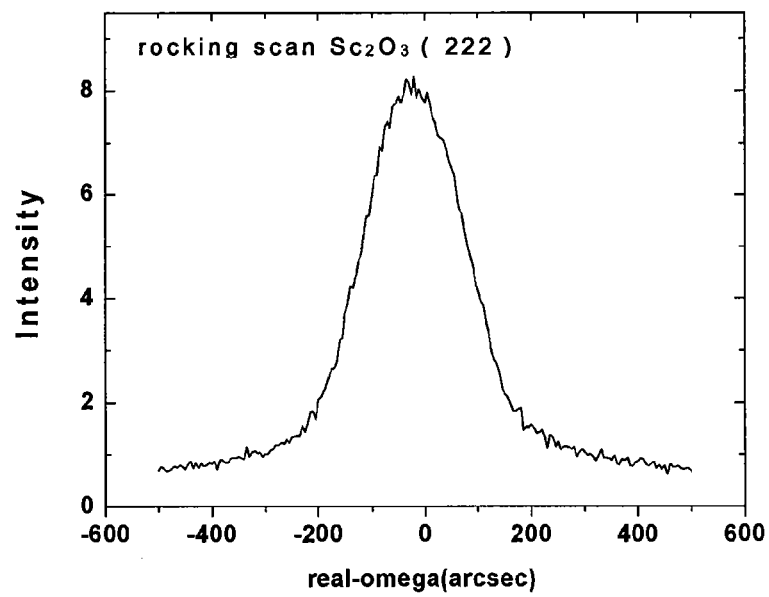
FIG. 4 is a plot to illustrate rocking scan results of the $Sc_2O_3$ film of the amorphous Si cap layer/$Sc_2O_3$ film/Si substrate structure made by the preferred embodiment.

Referring to FIGS. 3 and 4, the full width at half-maximum (FWHM) of the rocking curves (not shown) of the plane (111) of the Si substrate and the plane (222) of the $Sc_2O_3$ film are 10 (close to the XRD resolution) and 97 arcsec, respectively. The narrow rocking curve of the plane (222) of the $Sc_2O_3$ film again indicates the $Sc_2O_3$ film according to this invention is a high-quality oxide film.

According to pole-figure scans of the $Sc_2O_3$ {440} peaks, the axes <111> of the $Sc_2O_3$ film and the Si substrate are well-aligned, and all the other unit cell vectors of the $Sc_2O_3$ film and the Si substrate are parallel.

Figure 5:
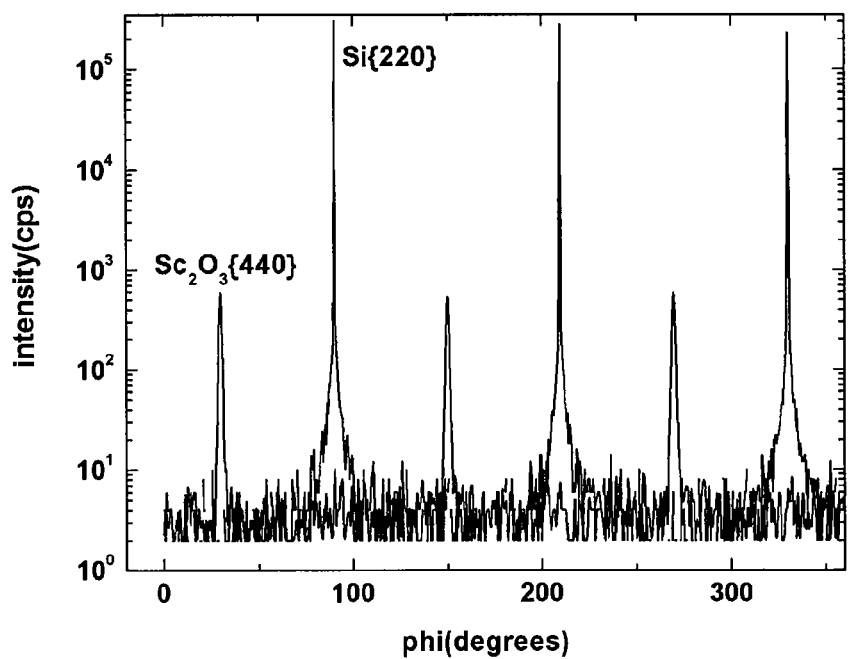
FIG. 5 is a plot to illustrate cone scan results along the direction {440} of the $Sc_2O_3$ film and the direction {220} of the Si substrate.

Referring to FIG. 5, the in-plane cone scans of the $Sc_2O_3$ {440} and Si {220} diffraction peaks about the surface normal show a 60° in-plane symmetry rotation of the $Sc_2O_3$ film with respect to the Si substrate surface orientation, and a 3-fold symmetry, which indicates attainment of a single domain of the $Sc_2O_3$ film.

Figure 6:
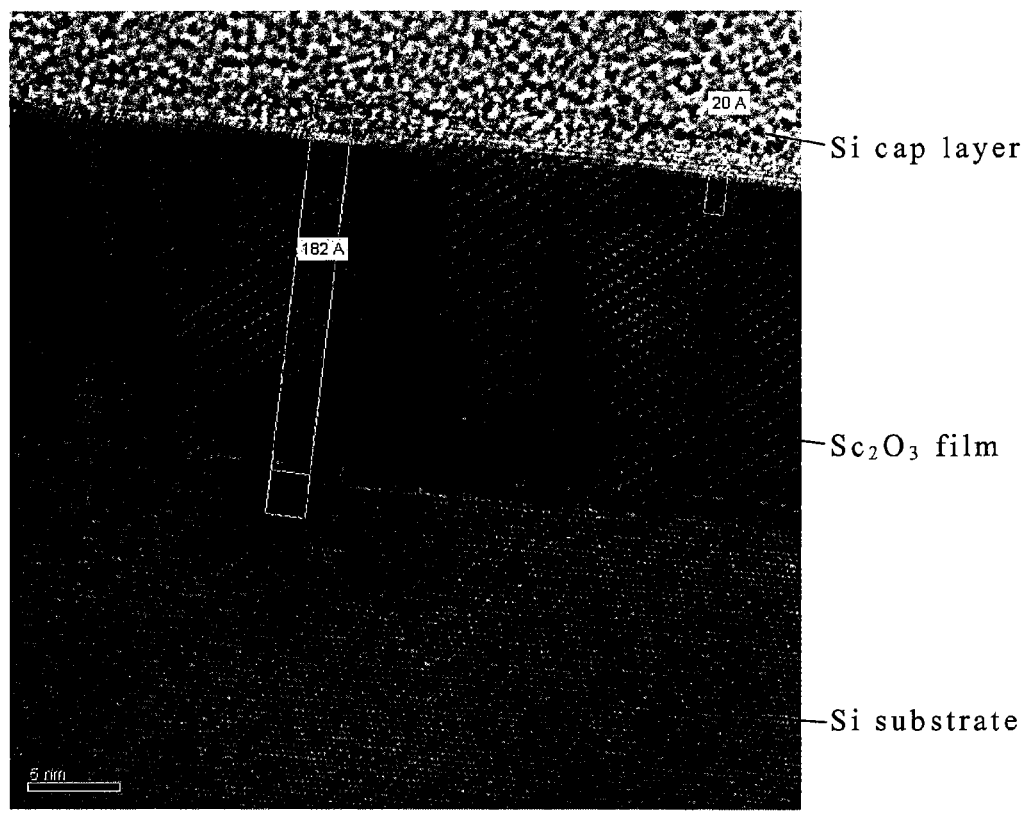
FIG. 6 is a high resolution transmission electron microscopy (HRTEM) photograph of the amorphous Si cap layer/$Sc_2O_3$ film/Si substrate structure made by the preferred embodiment.

Referring to FIG. 6, according to the HRTEM picture, there was no silicon oxide formed between the Si substrate and the $Sc_2O_3$ film. This indicates that cleaning of the Si substrate using electron beam evaporation techniques is excellent in keeping the interface between the $Sc_2O_3$ film and the Si substrate clean and sharp. The smooth interface between the $Sc_2O_3$ film and the Si substrate, which was determined using HRTEM, is consistent with the results obtained from RHEED (not shown) and X-ray reflectivity analyses of FIG. 2. The plan-view and cross-sectional HRTEM observations of FIG. 6 show that the crystal quality of the $Sc_2O_3$ film is almost defect-free according to presence of distinct Morie fringes and strain contrast: the $Sc_2O_3$ film is highly strained in order to accommodate the existing lattice mismatch. However, no structural defects, such as threading dislocations and micro-twins, were found morphologically in the $Sc_2O_3$ film. In addition, according to the result shown in FIG. 6, the amorphous Si cap layer has a thickness of about 20 Å, and the $Sc_2O_3$ film has a thickness of about 182 Å, which complies with the estimated thickness of the $Sc_2O_3$ film mentioned in the description concerning FIG. 2.

Figure 7:
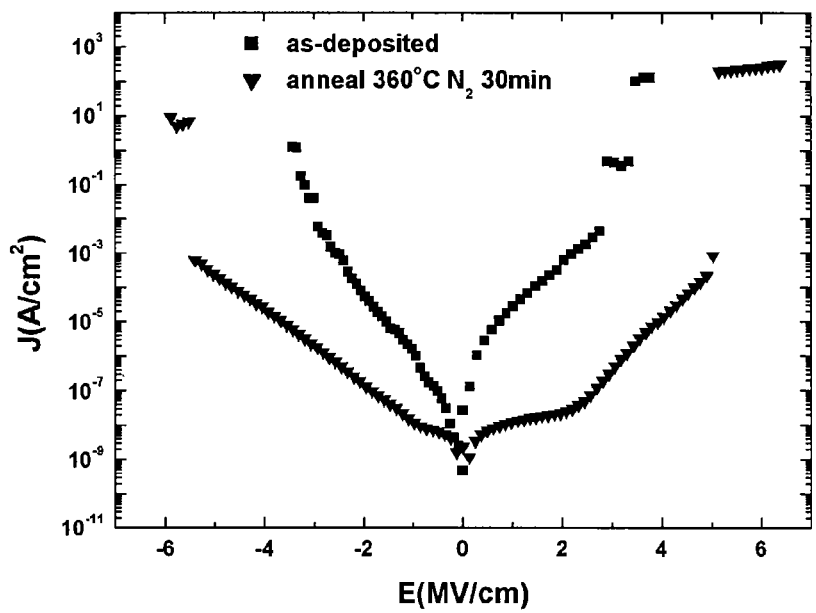
FIG. 7 shows leakage current density vs. electrical field characteristics for MOS diodes each including the $Sc_2O_3$ film on the Si substrate structure according to this invention, and a top electrode made from Au.

FIG. 7 shows characteristics of leakage current density (J) vs. electric field (E) for MOS diodes, each of which included the structure of the $Sc_2O_3$ film formed on the Si substrate made by the method according to this invention, and had a top electrode made from gold (Au). The leakage current density (J) of each MOS diode is obtained by dividing a leakage current (A) measured from the MOS diode by a measured area of the Au electrode ($7.85 \times 10^{-5}$ cm$^2$). The electrical field (E) of each MOS diode is obtained by dividing the biasing voltage (V) by the thickness of the $Sc_2O_3$ film and the amorphous Si cap layer. The positive bias means that the top metal electrode is positive with respect to the Si substrate. The MOS diodes under test included the $Sc_2O_3$ as-deposited (i.e. without annealing) and the $Sc_2O_3$ film annealed at 360° C. under a flow of pure $N_2$ for 30 minutes. The test results show that annealing reduces the defects in the $Sc_2O_3$ film, which may be produced by secondary electron bombardment during growth of the $Sc_2O_3$ film, and that the leakage current density is drastically reduced, for example from $10^{-3}$ A/cm$^2$ to less than $10^{-7}$ A/cm$^2$ at 2 MV/cm. Besides, the breakdown behavior of the $Sc_2O_3$ film is symmetric, and the breakdown field applied has been improved to more than 5 MV/cm.

In view of the foregoing analyses, even though the bulk lattice constants of the Si substrate and the $Sc_2O_3$ film, which are 5.43 Å and 9.86 Å, respectively, have a mismatch level up to about 9.2%, the $Sc_2O_3$ film can be grown epitaxially on the Si substrate according to the method of this invention. The structural perfection in the single crystal $Sc_2O_3$ film results in low electrical leakage currents and a high breakdown field, which indicate that only few electrical-induced defects are generated due to the large lattice mismatch between the $Sc_2O_3$ film and the Si substrate.

In addition, according to this invention, the single crystal $Sc_2O_3$ film is formed directly from the $Sc_2O_3$ powder source, and is not formed through compounding reaction of the metal Sc and the oxygen gas as disclosed in the prior art. Therefore, deterioration in the crystallization quality of the single crystal $Sc_2O_3$ film due to incompleteness of the compounding reaction can be avoided, and the defect density of the single crystal $Sc_2O_3$ film can be reduced.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method for forming a semiconductor device, comprising:
   placing a Si substrate and an $Sc_2O_3$ powder source in an oxide chamber; and
   vaporizing the $Sc_2O_3$ powder source in the oxide chamber so as to form a single crystal $Sc_2O_3$ film on the Si substrate through electron beam evaporation techniques.

2. The method of claim 1, wherein vaporization of the $Sc_2O_3$ powder source is conducted at a substrate temperature of 25° C. to 1200° C. under a vacuum pressure of $1 \times 10^{-10}$ Torr to $1 \times 10^{-5}$ Torr.

3. The method of claim 2, wherein the substrate temperature and the vacuum pressure are set at 770° C. and $1 \times 10^{-9}$ Torr, respectively.

4. The method of claim 1, further comprising removing native oxides formed on the Si substrate.

5. The method of claim 1, further comprising forming a cap layer on the single crystal $Sc_2O_3$ film formed on the Si substrate.

6. The method of claim 5, wherein the cap layer is made from a material selected from the group consisting of silicon, germanium, silica, and alumina.

7. The method of claim 1, further comprising forming an epitaxial layer made from a group III-V compound on the single crystal $Sc_2O_3$ film.

8. The method of claim 7, wherein the group III-V compound includes a group III element selected from the group consisting of B, Al, Ga, In, Ti, and combinations thereof.

9. The method of claim 7, wherein the group III-V compound includes a group V element selected from the group consisting of N, P, As, Sb, Bi, and combinations thereof.

10. The method of claim 7, wherein the epitaxial layer is made from a group III-V compound selected from the group consisting of GaN, GaAs, AlN, InN, AlP, AlAs, AlSb, InP, InAs, InSb, GaSb, and GaP.

* * * * *